(12) United States Patent
Suda et al.

(10) Patent No.: US 9,593,433 B2
(45) Date of Patent: Mar. 14, 2017

(54) CRYSTAL HOLDING MECHANISM OF SINGLE CRYSTAL PULLING DEVICE AND METHOD FOR PRODUCING SINGLE CRYSTAL INGOT

(75) Inventors: Ayumi Suda, Tokyo (JP); Takuya Yotsui, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 638 days.

(21) Appl. No.: 13/985,709

(22) PCT Filed: Apr. 4, 2012

(86) PCT No.: PCT/JP2012/059203
§ 371 (c)(1),
(2), (4) Date: Aug. 15, 2013

(87) PCT Pub. No.: WO2012/137822
PCT Pub. Date: Oct. 11, 2012

(65) Prior Publication Data
US 2013/0319318 A1    Dec. 5, 2013

(30) Foreign Application Priority Data
Apr. 6, 2011  (JP) .................................. 2011-84400

(51) Int. Cl.
*C30B 15/32* (2006.01)
*C30B 15/30* (2006.01)
*C30B 29/06* (2006.01)

(52) U.S. Cl.
CPC .............. *C30B 15/32* (2013.01); *C30B 15/30* (2013.01); *C30B 29/06* (2013.01); *Y10T 117/1032* (2015.01)

(58) Field of Classification Search
CPC ......... C30B 15/30; C30B 15/32; C30B 29/06; Y10T 117/1032
See application file for complete search history.

(56) References Cited

U.S. PATENT DOCUMENTS

| | | | |
|---|---|---|---|
| 6,042,644 A | 3/2000 | Kurosaka et al. | |
| 6,053,975 A | 4/2000 | Iida et al. | |
| 6,159,282 A | 12/2000 | Fujiwara | |
| 6,315,827 B1* | 11/2001 | Kurosaka ................ | C30B 15/30 117/13 |
| 2008/0022922 A1 | 1/2008 | Altekruger et al. | |
| 2010/0242836 A1* | 9/2010 | Korb ..................... | G01G 23/12 117/201 |

FOREIGN PATENT DOCUMENTS

| | | |
|---|---|---|
| DE | 698 01 069 T2 | 3/2002 |
| JP | 10-95690 | 4/1998 |
| JP | 10-273383 | 10/1998 |

(Continued)

*Primary Examiner* — Michael Kornakov
*Assistant Examiner* — Hua Qi
(74) *Attorney, Agent, or Firm* — Greenblum & Bernstein, P.L.C.

(57) ABSTRACT

The present invention is provided with a support on a gripping member, the support being composed of linear springs which elastically support an engaging portion. Thus, the support can be reused, and generation of rupture and dislocation of a single crystal ingot from a gripping part of the engaging portion can be prevented.

2 Claims, 9 Drawing Sheets

(56) References Cited

FOREIGN PATENT DOCUMENTS

| JP | 10-273389 | | 10/1998 |
|---|---|---|---|
| JP | 10273389 A | * | 10/1998 |
| JP | 2000-007490 | | 1/2000 |
| JP | 2000-169291 | | 6/2000 |
| JP | 3596226 B2 | | 12/2004 |
| JP | 2005-029434 | | 2/2005 |
| JP | 2008-31036 | | 2/2008 |

* cited by examiner

CRYSTAL HOLDING MECHANISM OF SINGLE CRYSTAL PULLING DEVICE AND METHOD FOR PRODUCING SINGLE CRYSTAL INGOT

TECHNICAL FIELD

The present invention relates to a crystal holding mechanism of a single crystal pulling device and a method for producing a single crystal ingot, and more particularly, to a crystal holding mechanism of a single crystal pulling device and a method for producing a single crystal ingot suitable for pulling up a single crystal ingot by the Czochralski method, especially a large-weighted one.

BACKGROUND ART

Generally, single crystal ingots have been grown by the Czochralski method (CZ method). In the CZ method, first, a mass of polycrystalline silicon filled in a crucible made of quartz is melted by heating using a heater to obtain a melt of silicon. Then, a lower end portion of a seed crystal attached to a seed holder is dipped into the silicon melt, and the seed holder and crucible are rotated while the seed holder is gradually pulled upward for causing a single crystal silicon ingot to grow at the lower end of the seed crystal.

Meanwhile, in the seed crystal, dislocation is generated by a thermal shock when the seed crystal is dipped into the melt. For eliminating this dislocation, a Dash necking process has been adopted. In the Dash necking process, the seed crystal after dipping is narrowed to be small in diameter to continuously form a neck portion on the order of a diameter of 3 mm from the seed crystal so as to release the dislocation to the front surface of the neck portion. After thus making the ingot free from dislocation, the pulling speed of the seed crystal is appropriately reduced, and a shoulder portion and straight trunk portion of the ingot are pulled up in sequence.

Recently, single crystal silicon ingots have been produced with larger diameters and longer lengths in order to improve the productivity and yield of devices. As a result, the ingots have been increased in weight, and there has been a possibility that the neck portion may rupture in the case of pulling up a single crystal ingot produced only with the conventional Dash necking process, which prohibits safe ingot growth.

Therefore, as a conventional art for solving this problem, for example, Patent Literature 1 is known. Patent Literature 1 is for forming, directly under the above-mentioned neck portion, an engaging portion in which an increased diameter portion and a reduced diameter portion (a constricted portion) continue, and by mechanically gripping the engaging portion by gripping members of a holding mechanism, for shifting the load of an ingot from the neck portion to the gripping mechanism to supplement insufficiency in strength of the neck portion.

Moreover, when growing a single crystal ingot, due to fluctuation in melt temperature and variation in accuracy of diameter control, it is impossible to make the shape of the outer peripheral surface of an ingot completely match a target shape. Therefore, on the outer peripheral surface of a formed engaging portion, annular unevenesses that are different in shape exist. Accordingly, contact between the gripping members and engaging portion results in point contact or line contact with a short contact width, and as a result of concentration of stress per unit area with respect to the ingot, rupture and dislocation of the ingot at a gripped location of the engaging portion have been generated. In the case of complete rupture of an ingot during single crystal ingot growth, this may have lead to a major accident of an ingot fall.

In order to solve this problem, in Patent Literature 1, there are provided at a contact part of the gripping members with the engaging portion attachment members made of a heat resistant soft material that are plastically deformed when receiving an ingot load. As a result of being plastically deformed, the attachment members are closely fitted to uneven parts of the ingot. Accordingly, the contact area between the gripping members and engaging portion is increased, and stress concentration per unit area with respect to the ingot is relieved.

CITATION LIST

Patent Literature

Patent Literature 1: Japanese Patent No. 3596226

SUMMARY OF INVENTION

Technical Problem

However, in the crystal holding mechanism described in Patent Literature 1, the shape of the attachment member is not restored after the attachment member is plastically deformed once due to the load of a single crystal silicon ingot. As a result, the attachment member has been used as a disposable product that is disposed of after only one-time use. Hence, replacement of the attachment member has been required every time performing ingot pulling including resuming pulling after having dislocation, which has led to a reduction in production efficiency of single crystal silicon ingots and high costs.

Therefore, as a result of intensive study, the present inventors have discovered that all of the foregoing problems can be solved by providing a support that can be freely deformed in an elastic deformation region of the material and can be repeatedly used at a contact part with the reduced diameter portion, of the gripping members of a crystal holding mechanism, and have thus completed the present invention.

The present invention aims to provide a crystal holding mechanism of a single crystal pulling device and a method for producing a single crystal ingot which allow reusing a support to serve as a contact part of gripping members with an engaging portion, and can prevent the generation of rupture and dislocation of a single crystal ingot from a gripped part of the engaging portion.

Solution to Problem

The present invention is a crystal holding mechanism of a single crystal pulling device which, when pulling up a seed crystal dipped into a melt in a crucible to grow a single crystal ingot, holds the single crystal ingot by gripping by use of a gripping member an engaging portion that is formed in a section from a neck portion continuous from the seed crystal to an upper portion of the single crystal ingot and is composed of an increased diameter portion and a reduced diameter portion continuous from the increased diameter portion, in which a support formed of a linear spring which elastically supports the engaging portion is provided on the gripping member.

Moreover, in the present invention, it is desirable to construct the linear spring by a wire rope for which a plurality of wires are twisted to form a strand and further a plurality of the strands are twisted.

Further, in the present invention, it is desirable that in the gripping member, slots disposed in pairs penetrating through upper and lower surfaces are formed separated from each other, and by winding the wire rope a plurality of times, around a winding core portion formed between the slots disposed in pairs, in elliptical shapes that are long in a vertical direction and so as to project at upper end portions from an upper surface of the winding core portion, the support is formed in a coil shape.

Also, another invention is a method for producing a single crystal ingot in which, when pulling up a seed crystal dipped into a melt in a crucible to grow a single crystal ingot, the single crystal ingot is held by a crystal holding mechanism, while the single crystal ingot is grown, in which an engaging portion composed of an increased diameter portion and a reduced diameter portion continuous from the increased diameter portion is formed in a section from a neck portion continuous from the seed crystal to an upper portion of the single crystal ingot, the crystal holding mechanism has a gripping member on which a support formed of a linear spring which elastically supports the engaging portion is provided to grip the engaging portion, and after formation of the engaging portion, by gripping the engaging portion by the gripping member, the engaging portion is elastically supported by the support, and growth of the single crystal ingot is performed in this state.

Advantageous Effects of Invention

According to these inventions, a single crystal ingot is pulled up from a melt by the Czochralski method. At that time, by gripping the engaging portion by the gripping member, a part or the whole of the load (self-load) of the single crystal ingot shifts from the neck portion to the crystal holding mechanism, so that the bearing load of the single crystal ingot by the neck portion is relieved. At this time, the engaging portion (reduced diameter portion) of the single crystal ingot is supported by the gripping member via the corresponding support. Therefore, the support is deformed (elastically deformed) by the action of the load of the single crystal ingot, in an elastic deformation region of the linear spring, so that the contact area with the engaging portion is increased. This contact area becomes large as the load of the single crystal ingot increases. As a result, the stress per unit area that acts on a contact part of the engaging portion with the gripping member is reduced, and the generation of rupture and dislocation of the single crystal silicon ingot from a gripped part of the engaging portion can be prevented.

Furthermore, the support is not plastically deformed, but is constructed of a linear spring the shape of which can be freely restored in its elastic deformation region. Therefore, even when a single crystal ingot has been grown and then another single crystal ingot is grown in sequence or even when a regrowth operation of a single crystal ingot caused by dislocation of a single crystal ingot generated in the middle of growth is performed, the support can be reused over multiple times without being replaced with a new product. As a result, the maintenance costs of the crystal holding mechanism can be reduced.

Particularly, in the case of adopting, as a linear spring for a support, one with a wire rope structure for which a plurality of wires are twisted into a strand and further a plurality of the strands are twisted, when stress loading due to the load of the single crystal ingot acts on the support, even in the single linear spring, the twisting position of strands and the twisting position of wires subtly change in the support so as to fit unevenness of the engaging portion of the single crystal ingot. Accordingly, the contact area between the support and the engaging portion can be further increased.

Moreover, in the present invention, it may be possible to form, in the gripping member, slots disposed in pairs penetrating through upper and lower surfaces are formed separated from each other, and to wind the wire rope a plurality of times, around a winding core portion between the slots, in elliptical shapes that are long in a vertical direction and so as to project at upper end portions from an upper surface of the winding core portion, so as to form the support in a coil shape. In this case, in addition to an elastic deformation effect of the wire rope itself, because the wire rope is wound so that the support projects from an upper surface of the grip claw portion, an elastic deformation effect due to deformation of the coil shape can also be obtained. As a result, local stress concentration in the contact site can be further inhibited.

DESCRIPTION OF EMBODIMENTS

Figure 1:
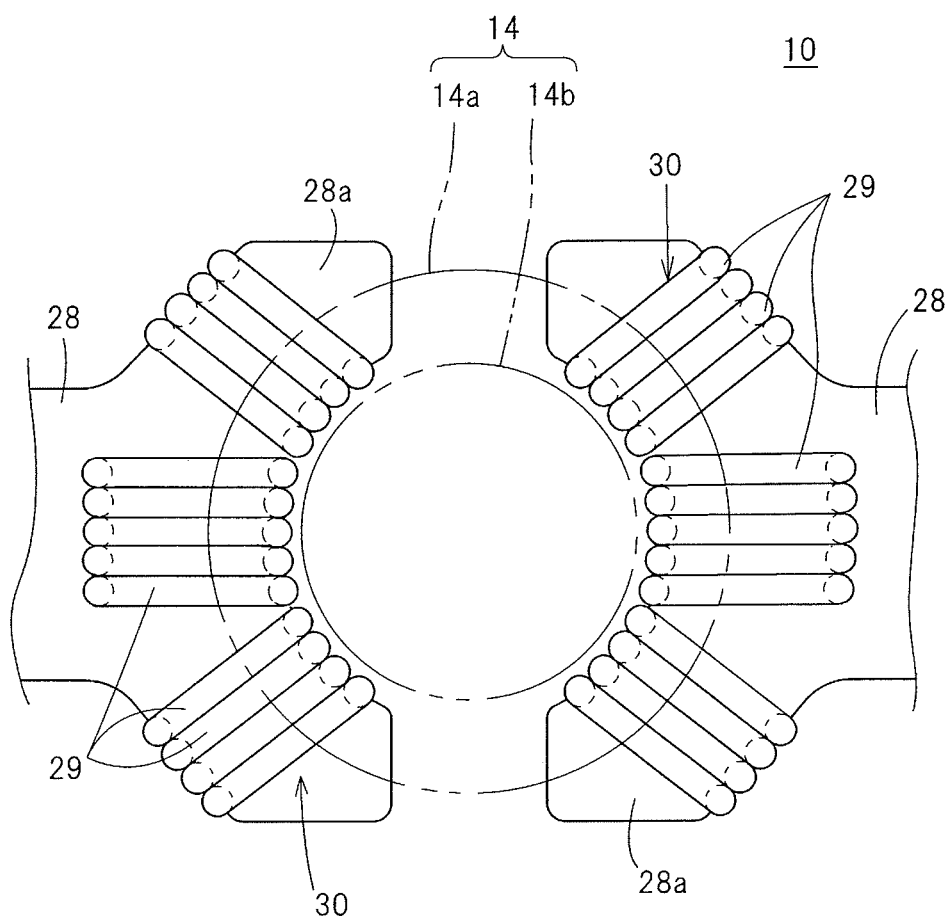
FIG. 1 is a main part enlarged plan view of a crystal holding mechanism of a single crystal pulling device according to Example 1 of the present invention.

The present invention is a crystal holding mechanism of a single crystal pulling device which, when pulling up a seed crystal dipped into a melt in a crucible to grow a single crystal ingot, holds the single crystal ingot by gripping by use of a gripping member an engaging portion that is formed in a section from a neck portion continuous from the seed crystal to an upper portion of the single crystal ingot and is composed of an increased diameter portion and a reduced diameter portion continuous from the increased diameter portion, in which a support formed of a linear spring which elastically supports the engaging portion is provided on the gripping member.

Also, another invention is a method for producing a single crystal ingot in which, when pulling up a seed crystal dipped into a melt in a crucible to grow a single crystal ingot, the single crystal ingot is held by a crystal holding mechanism, while the single crystal ingot is grown, in which an engaging portion composed of an increased diameter portion and a reduced diameter portion continuous from the increased diameter portion is formed in a section from a neck portion continuous from the seed crystal to an upper portion of the single crystal ingot, the crystal holding mechanism has a gripping member on which a support formed of a linear spring which elastically supports the engaging portion is provided to grip the engaging portion, and after formation of the engaging portion, by gripping the engaging portion by the gripping member, the engaging portion is elastically supported by the support, and growth of the single crystal ingot is performed in this state.

By these inventions, because the reduced diameter portion of the engaging portion is supported by the gripping member via the corresponding support, when the engaging portion is gripped, the support is deformed (elastically deformed), by the load of the single crystal ingot, in an elastic deformation region of the linear spring, so that the contact area with the engaging portion is increased. As a result, the stress per unit area that acts on a contact part with this gripping member is reduced, and the generation of rupture and dislocation of the single crystal ingot from a gripped part of the engaging portion can be prevented.

Furthermore, the support is not plastically deformed, but is constructed of a linear spring the shape of which can be freely restored in its elastic deformation region. Therefore, even when a single crystal ingot has been grown and then another single crystal ingot is grown in sequence or even when a regrowth operation of a single crystal ingot caused by dislocation of a single crystal ingot generated in the middle of growth is performed, the support can be reused over and over without being replaced with a new one. As a result, the maintenance costs of the crystal holding mechanism can be reduced.

As the single crystal ingot, for example, single crystal silicon can be adopted. Besides this, a sapphire single crystal, a ferrite single crystal, and single crystal silicon for solar cells may be adopted.

As the single crystal pulling device, various Czochralski-type single crystal pulling devices can be adopted. Examples that may be adopted include an MCZ method in which a single crystal ingot is pulled up with a high magnetic field applied.

The "section between a neck portion and an upper portion of the single crystal ingot" mentioned here means, with reference to a neck portion directly under a seed crystal, a range from this neck portion to a shoulder portion of the single crystal ingot or a range from the neck portion to an upper portion of a straight trunk portion.

The "support . . . which elastically supports the engaging portion . . . on the gripping member" mentioned here means that the support is deformed by the action of the load of the single crystal ingot so that the contact area with the engaging portion is increased to elastically support the engaging portion by the support formed of a linear spring. For example, in the case of a support formed of a coil-shaped linear spring, the contact area of the support with the engaging portion is increased by the load of the single crystal ingot acting in a manner of crushing the coil from the radial direction.

The engaging portion means a Japanese abacus bead-shaped bulging part disposed above a single crystal ingot that is obtained by adjusting the pulling speed of a seed crystal. Specifically, the engaging portion is composed of a truncated cone shaped increased diameter portion that is larger in diameter than the neck portion, the area of a lower base of which is larger than the area of an upper base of which, and that is gradually increased in diameter toward the downside and an inverted truncated cone shaped reduced diameter portion that is continuous from the increased diameter portion integrally therewith, the area of an upper base of which is larger than the area of a lower base of which, and that is gradually reduced in diameter toward the downside. Moreover, a section of the neck portion between the engaging portion and the single crystal ingot has a larger diameter than that of a section between the seed crystal and engaging portion of the neck portion so as not to rupture when the single crystal ingot becomes heavy-weight.

The "linear spring" mentioned here means a member (a spring wire form) a cross-section orthogonal to the longitudinal direction of which has a circular shape and which has a slender shape like a line to absorb and accumulate energy.

Examples of the material for the linear spring that can be mentioned include spring steels (SUP), hard drawn steel wires (SWC), stainless steels (SUS), and piano wires (SWP).

As the linear spring, spring wire forms in various shapes such as a circular arc shape and a ring shape can be adopted, besides a coil spring.

Examples of the appearance shape of the support that can be adopted include a spiral shape, a circular shape, and a circular arc shape. The number of supports to be used may be either one or two. Examples that may be used include one for which a large number of ring-shaped linear springs are juxtaposed at predetermined pitches with their axes made coincident.

Examples of the shape of the gripping member that can be mentioned include a Y-shape and a U-shape so that the engaging portion can be gripped using a plurality of gripping members.

The number of gripping members to be used is two, three, or more. Because the gripping members pull a single crystal ingot with their distal end portions catching the increased diameter portion of the engaging portion, the location on which the load of the single crystal ingot mostly acts is a contact part, of the reduced diameter portion, with the gripping members.

Moreover, in the present invention, it is desirable to adopt, as the linear spring, a wire rope for which a plurality of wires are twisted to form a strand and further a plurality of the strands are twisted. In this case, by changing the diameter of each wire and/or the number of wires that compose the linear spring (wire rope) and changing the twisting method of the wires, the elastic force of the support can be arbitrarily changed. As a result, when stress loading due to the load of the single crystal ingot acts on the support, the support easily becomes subtly deformed as a result of the strands that construct the linear spring and the wires that construct the strands appropriately moving in the support so as to fit unevenness of the engaging portion of the single crystal ingot. Accordingly, the contact area between the support and the engaging portion is further increased, the stress per unit area that acts on a contact part of the engaging portion with the grip member is reduced, and the generation of rupture and dislocation of the single crystal ingot from a gripped part of the engaging portion can be prevented.

As the material for the wires of a wire rope, it is desirable to adopt a high-melting point material excellent in heat resistance, such as, for example, tantalum, molybdenum, stainless steel, tungsten, and an ally of these.

The twisting method for the wire rope is arbitrary. It suffices to arbitrarily select the number of wires that compose a strand and the number of strands, such as, 7 strands of 7 wires each and 6 strands of 12 wires each. In terms also of the rope bundling method, a publicly known type of rope can be adopted, such as a Filler type rope, a Warrington type rope, a Seale type rope, a Nuflex type rope, and a Hercules type rope. Moreover, as the diameter of the wire rope, because a rope break may occur or the elastic deformation force is insufficient if the wire rope is too thin in diameter and it becomes difficult to attach the same to a gripping member if the diameter is too thick in diameter, it is desirable to adopt a wire rope the diameter of which is on the order of 1 mmm to 10 mm.

Further, in the present invention, it is desirable to form, in the gripping member, slots disposed in pairs penetrating through upper and lower surfaces are formed separated from each other, and to wind the wire rope a plurality of times, around a winding core portion formed between the slots disposed in pairs, in elliptical shapes that are long in a vertical direction and so that upper end portions of the wire rope project from an upper surface of the winding core portion, so as to form the support in a coil shape. Accordingly, in addition to an elastic deformation effect of the wire rope itself, an elastic deformation due to deformation of the coil shape, which is caused by winding the wire rope so that the support projects from an upper surface of the grip claw portion, can also be obtained. As a result, local stress concentration in the contact site can be further inhibited.

The slots to be formed in the gripping member may be a pair, two pairs, or three pairs or more.

Example 1

Next, a crystal holding mechanism of a single crystal pulling device and a method for producing a single crystal ingot according to Example 1 of the present invention will be described with reference to FIG. 1 to FIG. 5.

Figure 2:
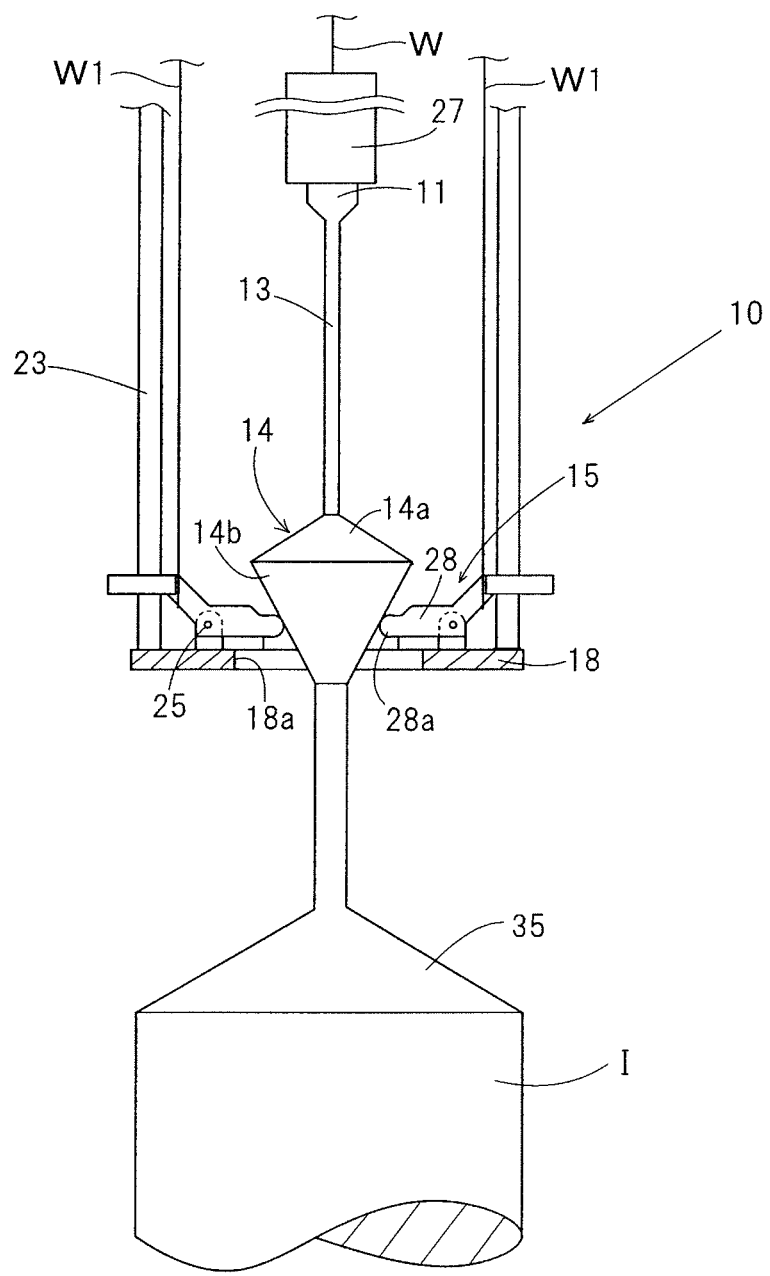
FIG. 2 is a front view in a using state of the crystal holding mechanism of a single crystal pulling device according to Example 1 of the present invention.

In FIG. 2, reference numeral 10 denotes a crystal holding mechanism of a single crystal pulling device (hereinafter, a crystal holding mechanism) according to Example 1 of the present invention. This crystal holding mechanism 10, when pulling up a seed crystal 11 dipped into a melt in a crucible to grow a single crystal silicon ingot (a single crystal ingot) I, holds the single crystal silicon ingot I by gripping by means of two gripping members 15 an engaging portion 14 that is formed in a section from a neck portion 13 provided continuously from the seed crystal 11 to make the single crystal silicon ingot I free from dislocation to an upper portion of the single crystal silicon ingot I and is composed of an increased diameter portion 14a and a reduced diameter portion 14b continuous from the increased diameter portion 14a.

In the following, these constructs will be specifically described.

The single crystal pulling device adopts the Czochralski method to pull up a single crystal silicon ingot I the diameter of a straight trunk portion of which is 450 mm.

The single crystal pulling device includes a hollow cylinder-shaped main chamber and a pull chamber continuously provided on the main chamber and having a diameter smaller than that of the main chamber. At a center portion in the main chamber, a crucible is fixed on a pedestal that is capable of rotation and rising and falling. A heater is disposed on the outer periphery of the crucible.

In an upper portion of an interior space of the pull chamber, a wire pulling mechanism is provided that performs unwinding of a wire W from a drum and winding up onto the drum. At the distal end of the hung-down wire W, a seed chuck 27 is provided, and at a lower end portion of the seed chuck 27, an upper portion of the seed crystal 11 is removably fixed.

Moreover, in the upper portion of the interior space of the pull chamber, a rising/falling and rotating mechanism of the crystal holding mechanism 10 is stored, and due to this rising/falling and rotating mechanism, the crystal holding mechanism 10 rises and falls and rotates at a predetermined speed in a predetermined direction.

The crystal holding mechanism 10 has a cylinder-shaped frame 23 through a space inside of which a wire W for pulling up an ingot is inserted to cause rising and falling and rotation of the single crystal silicon ingot I. At the lower end of the frame 23, a doughnut-shaped rising and falling plate 18 having an inner space 18a is provided. On an upper surface of the rising and falling plate 18, at two locations facing each other in its circumferential direction, a pair of gripping members 15 that grip the above-mentioned engaging portion 14 are provided separated from each other so as to be freely turnable about a short horizontal shaft 25. In distal end portions of these gripping members 15, grip claw portions 28 that are disposed opposed to each other are respectively integrally formed. In an upper portion of the frame 23, a claw portion operating mechanism is provided that shifts the pair of grip claw portions 28 from an open state to a closed state by respectively operating two operation wires W1 to rise and fall by a pair of wire winding devices. A lower end portion of each operation wire W1 is coupled to a base portion of a corresponding gripping member 15.

When the crystal holding mechanism 10 is used, the two operation wires W1 of the claw portion operating mechanism are operated to rise and fall according to necessity so as to first have the pair of grip claw portions 28 in a closed state. These grip claw portions 28 do not contact the narrow neck portion 13 even in the closed state. Then, by rotating while gradually rewinding at a predetermined speed the wire W unwound from the drum of the wire pulling mechanism, the seed chuck 27, the seed crystal 11, and the neck portion 13 pass without contact through a space inside of the grip claw portions 28 in order. Then, these grip claw portions 28 abut against the increased diameter portion 14a of an upper end portion of the engaging portion 14 that rises in the inner space, and at that time, gradually turn in the opening direction about the horizontal shafts along a smooth outer surface gradually increased in diameter of the increased diameter portion 14a. Then, these grip claw portions 28 turn in the closing direction about the horizontal shafts due to the self-weight of each grip claw portion 28 at the point in time of allowing passage of the increased diameter portion 14a, and these grip claw portions 28 finally reach a closed state. Then, when the whole of the engaging portions 14 has been pulled up to above the grip claw portions 28, by causing the rising and falling plate 18 to rise via the frame 23 by the rising/falling and rotating mechanism of the crystal holding mechanism 10, a gripped position of the reduced diameter portion 14b is gripped by the pair of grip claw portions 28.

From this time onward, the single crystal silicon ingot I is mechanically held at the engaging portion 14 by these gripping members 15, while being pulled up at a low speed while rotating at a predetermined speed in a predetermined speed direction by the rising/falling and rotating mechanism.

Figure 3:
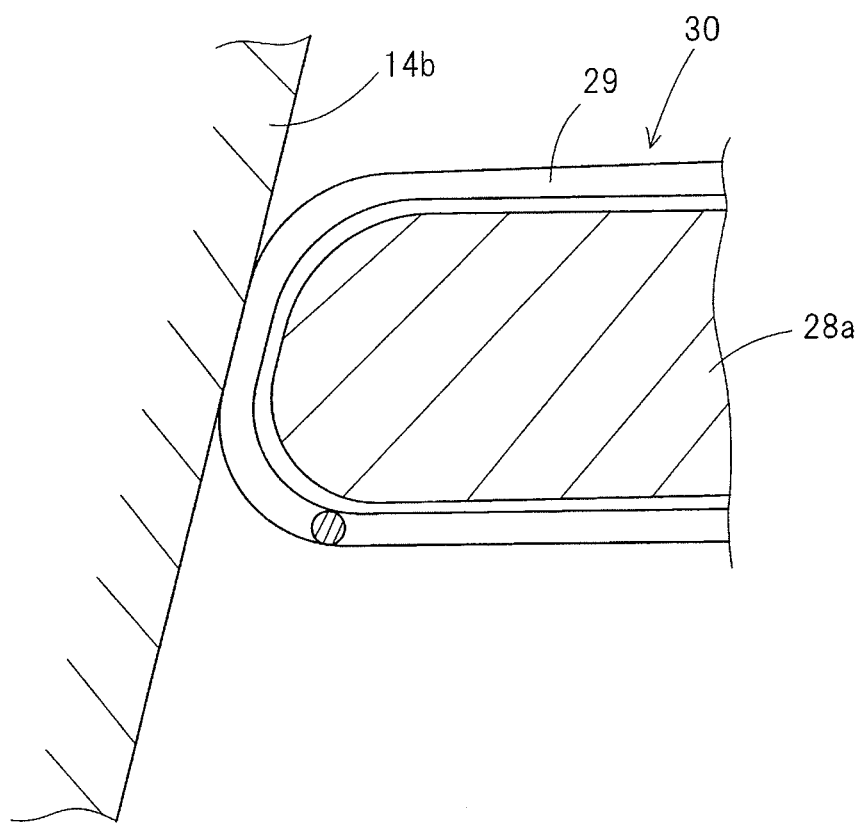
FIG. 3 is a main part enlarged longitudinal sectional view showing a using state of the crystal holding mechanism of a single crystal pulling device according to Example 1 of the present invention.
Figure 4:
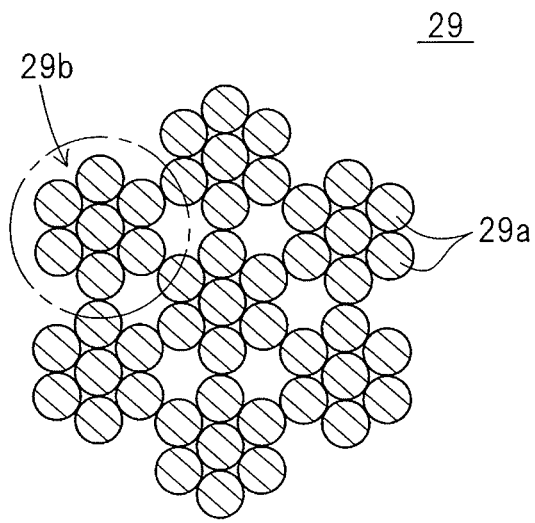
FIG. 4 is a main part enlarged sectional view of a support being a component of a crystal holding mechanism of a single crystal pulling device according to Example 1 of the present invention.
Figure 5:
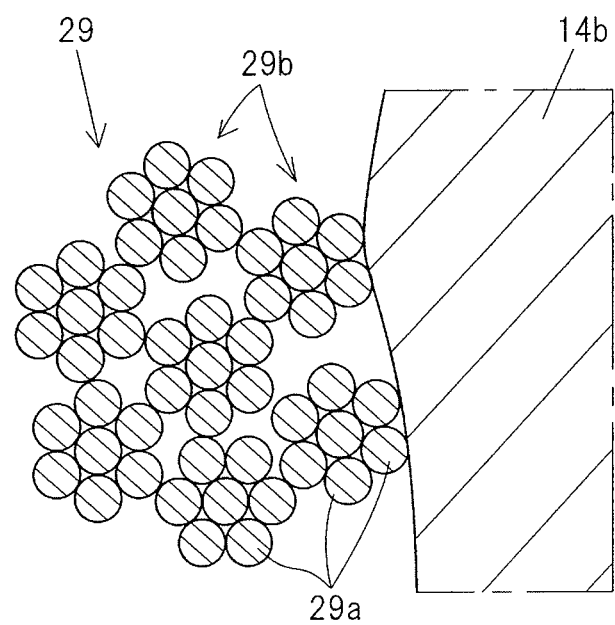
FIG. 5 is a main part enlarged sectional view showing a using state of the support being a component of the crystal holding mechanism of a single crystal pulling device according to Example 1 of the present invention.

These grip claw portions 28 have distal end portions 28a having Y-shapes in a plan view. At their outer peripheral surfaces, by a wire rope (a linear spring) 29 being wound therearound many times in the vertical direction, coil-like supports 30 are provided that cover, of these grip claw portions 28, the entire area of distal end surfaces having circular arc shapes to serve as contact surfaces with the reduced diameter portion 14b (FIG. 1 and FIG. 3). For the wire rope 29, seven tungsten-made wires 29a are twisted to form a single strand 29b, and seven strands 29b are twisted (FIG. 4). The diameter of each wire 29a is 0.16 mm, and the diameter of the wire rope 29 is 2.5 mm. The shapes of the grip claw portions 28 may be either U-shapes or C-shapes in a plan view.

In the following, a method for producing a single crystal ingot according to Example 1 of the present invention will be described.

As shown in FIG. 2, in ingot growth by the crystal pulling device of Example 1, the wire W in the middle is unwound from the drum by the wire pulling mechanism, a lower end portion of the seed crystal 11 is dipped into a melt in the crucible to melt the same, and the seed crystal 11 is left standing as it is for a predetermined time so as to adapt to the melt. Then, the wire W is rotated in a predetermined direction at a predetermined speed via the rising/falling and rotating mechanism and the wire pulling mechanism, and the crucible is rotated at a predetermined speed in a predetermined direction.

Next, the wire W is gradually pulled up by the wire pulling mechanism to form at the lower end of the seed crystal 11 a neck portion 13 to make a single crystal silicon ingot I free from dislocation, and by continuing the pulling thereafter, a shoulder portion 35 and straight trunk portion of the single crystal silicon ingot I are grown in sequence. Here, in a section from the neck portion 13 to where the shoulder portion 35 is grown, the pulling speed of the wire W by the wire pulling mechanism is adjusted to grow one bead-shaped engaging portion 14 composed of an increased diameter portion 14a and a reduced diameter portion 14b. In addition, a section of the neck portion 13 between the engaging portion 14 and the single crystal silicon ingot I has a diameter larger than that of a section of the neck portion 13 between the seed crystal 11 and the engaging portion 14 so as not to rupture when the single crystal ingot becomes heavy-weight.

Next, by further rewinding the wire W by the wire pulling mechanism, the seed chuck 27, the seed crystal 11, and the neck portion 13 pass without contact through the inner space 18a of the rising and falling plate 18 and the space inside of the grip claw portions 28. These grip claw portions 28 in a closed state then abut against the increased diameter portion 14a of an upper end portion of the engaging portion 14 that rises in the inner space, and at that time, gradually turn in the opening direction about the horizontal shafts along a smooth outer surface gradually increased in diameter of the increased diameter portion 14a. Then, these grip claw portions 28 turn in the closing direction about the horizontal shafts due to the self-weight of each grip claw portion 28 at the point in time of allowing passage of the increased diameter portion 14a, and these grip claw portions 28 finally reach a closed state. Then, when the whole of the engaging portions 14 has been pulled up to above the grip claw portions 28, by causing the rising and falling plate 18 to rise via the frame 23 by the rising/falling and rotating mechanism of the crystal holding mechanism 10, a gripped position of the reduced diameter portion 14b is gripped by the pair of grip claw portions 28. The wire W is wound up on the drum at a predetermined speed by the wire pulling mechanism in this state, and the operation wires W1 are operated by the rising/falling and rotating mechanism so that the single crystal silicon ingot I is pulled up at the same speed as this speed to cause the frame 23 to rise at a predetermined speed and cause the same to rotate at a predetermined rotating speed in a predetermined direction while gradually growing the single crystal silicon ingot I.

Thus, the reduced diameter portion 14b of the engaging portion 14 is supported by the two gripping members 15 via the pair of supports 30 formed of large numbers of wire ropes 29, so that when the engaging portion 14 is gripped, the supports 30 are deformed (elastically deformed), by the load of the single crystal silicon ingot I, in an elastic deformation region of the wire ropes 29, in a manner of crushing the coil-shaped supports 30 from the radial direction. This deformation becomes significant as the single crystal silicon ingot I becomes heavier with progress in the growth thereof. As a result, as compared with the case of a conventional crystal holding mechanism, the contact area of these grip claw portions 28 with the reduced diameter portion 14b is increased, the stress per unit area that acts on a contact part with the grip claw portions 28 is reduced, and the generation of rupture and dislocation of the single crystal silicon ingot I from a gripped part of the engaging portion 14 can be prevented.

Furthermore, the supports 30 are not plastically deformed as in the conventional crystal holding mechanism, but are constructed of wire ropes 29 the shape of which can be freely restored in their elastic deformation region. Therefore, even when a single crystal silicon ingot I has been grown and then another single crystal silicon ingot I is grown in sequence or even when a regrowth operation of a single crystal silicon ingot I caused by dislocation of a single crystal silicon ingot I generated in the middle of growth is performed, the supports 30 can be reused over and over without being replaced with new ones. As a result, a reduction in maintenance costs of the crystal holding mechanism 10 is achieved.

Moreover, because the supports 30 are constructed by wire ropes 29, by performing a change in the diameter of each wire 29a that constructs the wire rope 29 and a change in the twisting method of the wires 29a, the elastic force of the supports 30 can be arbitrarily changed. As a result, when stress loading due to the load of the single crystal silicon ingot I acts on the supports 30, the supports 30 can be subtly deformed (FIG. 5) by moving (sliding sideways) the strands 29b and the wires 29a that construct each wire rope 29 in the supports 30 so as to fit unevenness of the engaging portion 14 of the single crystal silicon ingot I. Accordingly, the contact area between the supports 30 and the engaging portion 14 can be further increased. Furthermore, the contact rate between the reduced diameter portion 14b and the supports 30 in the circumferential direction of the reduced diameter portion 14b is also increased (for example, 80 to 90%) as compared to that in the case of a conventional product (for example, 40 to 60%), and local stress concentration in the contact site can be inhibited.

Example 2

Next, a crystal holding mechanism of a single crystal pulling device according to Example 2 of the present invention will be described with reference to FIG. 6 to FIG. 8.

Figure 6:
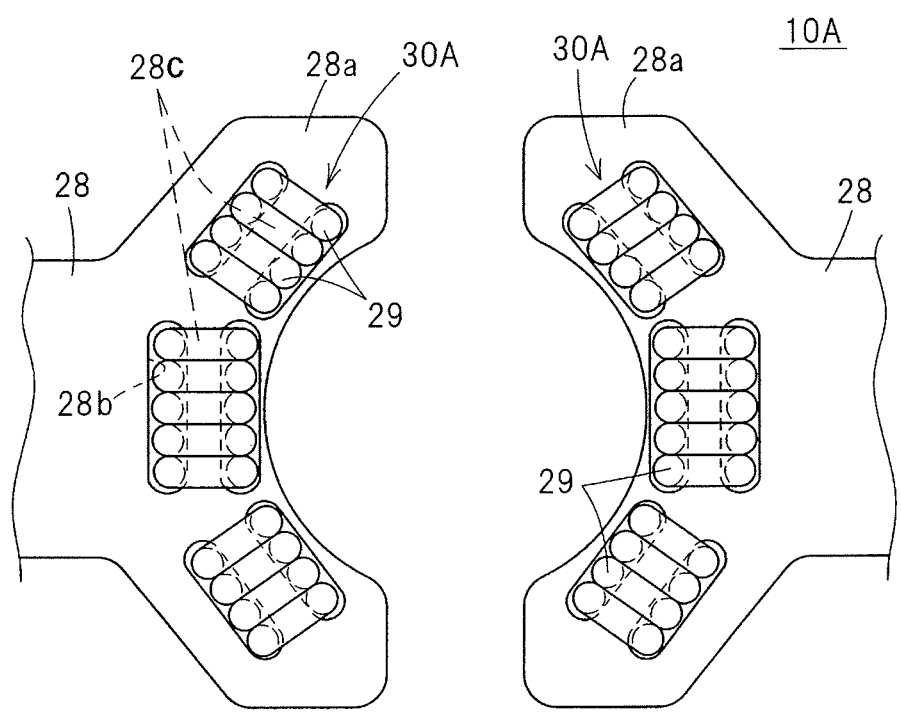
FIG. 6 is a main part enlarged plan view showing a using state of a support being a component of a crystal holding mechanism of a single crystal pulling device according to Example 2 of the present invention.
Figure 7:
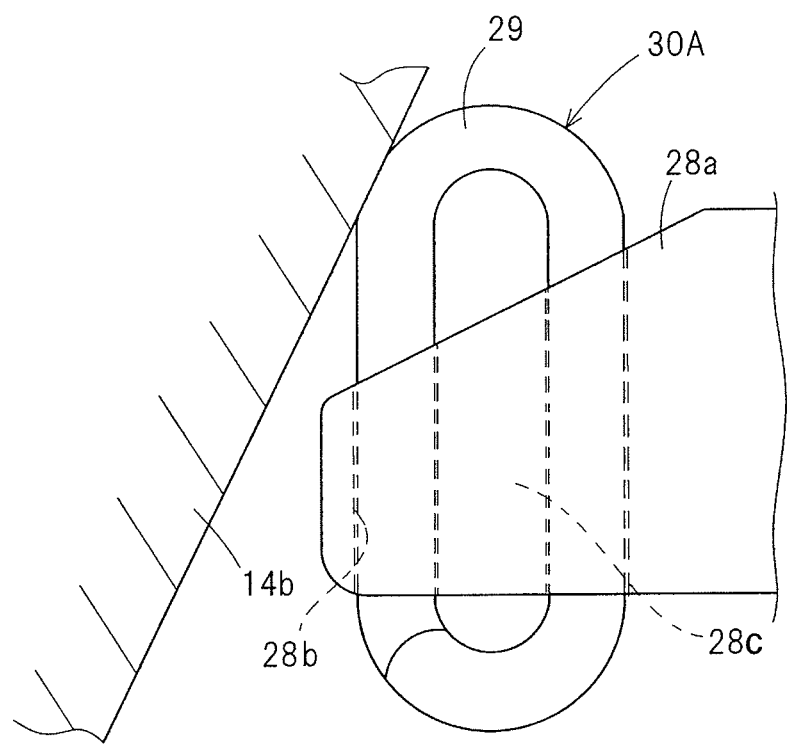
FIG. 7 is a main part enlarged longitudinal sectional view showing a using state of the crystal holding mechanism of a single crystal pulling device according to Example 2 of the present invention.

As shown in FIG. 6 and FIG. 7, the crystal holding mechanism 10A of a single crystal pulling device of Example 2 of the present invention is characterized in that the distal end portions 28a of these grip claw portions 28 having substantially Y-shapes in a plan view are formed to be gradually thin-walled toward the tips, respectively, and in the distal end portions 28a of these grip claw portions 28, supports 30A are embedded in part.

Specifically, of the distal end portions 28a of these grip claw portions 28 that are tapered, in end parts and middle parts of these in the width direction, a total of three pairs of slots 28b that are separated from each other in parallel in the inward-outward direction are respectively formed, and between each pair of corresponding slots 28b, a winding core portion 28c for the wire rope 29 is integrally formed of the same material as that of these grip claw portions 28. Then, by winding the wire rope 29 around each winding core portion 28c many times in elliptical shapes that are long in the vertical direction, supports 30A are formed in coil shapes. At this time, an upper end portion of each winding of the wire rope 29 projects from an upper surface of the grip claw portion 28, and a lower end portion of each winding of the wire rope 29 projects from a lower surface of the grip claw portion 28.

When a single crystal silicon ingot I is held, upwardly projecting upper end portions of the supports 30A abut against the reduced diameter portion 14b of the engaging portion 14, as a result of the load of the single crystal silicon ingot I being applied thereto, the supports 30A are elastically deformed in a manner of crushing the coils in the radial direction so as to follow the outer surface shape of the reduced diameter portion 14b. Accordingly, local stress concentration in the contact site can be further inhibited. Furthermore, in addition to an elastic deformation effect of the wire ropes 29 themselves, as a result of winding the wire ropes 29 so that the supports 30A project from the upper surfaces of the grip claw portion 28, an elastic deformation (cushioning) effect due to deformation of the coil shape can also be obtained. As a result, local stress concentration in the contact site can be further inhibited still.

Figure 8:
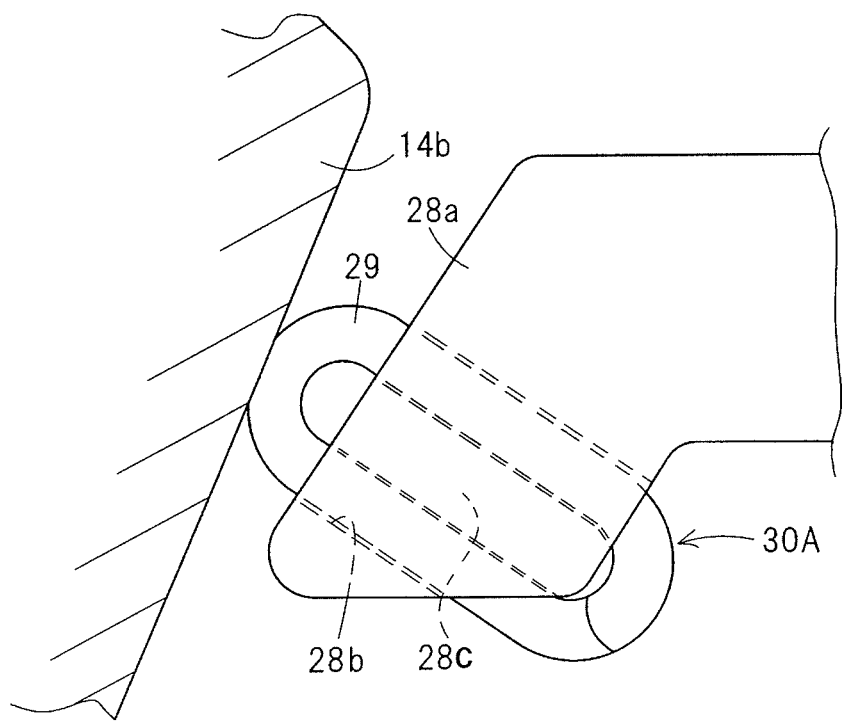
FIG. 8 is a main part enlarged longitudinal sectional view showing a using state of another crystal holding mechanism of a single crystal pulling device according to Example 2 of the present invention.

Alternatively, as shown in FIG. 8, by bending the distal end portions 28a of these grip claw portions 28 obliquely downward according to an inclination angle of the reduced diameter portion 14b of the engaging portion 14, the upper end portions of the supports 30A may be abutted against an outer peripheral surface of the reduced diameter portion 14b substantially at right angles to increase the thickness of these grip claw portions 28.

Because other aspects of the configuration and the operation and effects are the same as those of Example 1, description will be omitted.

Example 3

Next, a crystal holding mechanism of a single crystal pulling device according to Example 3 of the present invention will be described with reference to FIG. 9 and FIG. 10.

Figure 9:
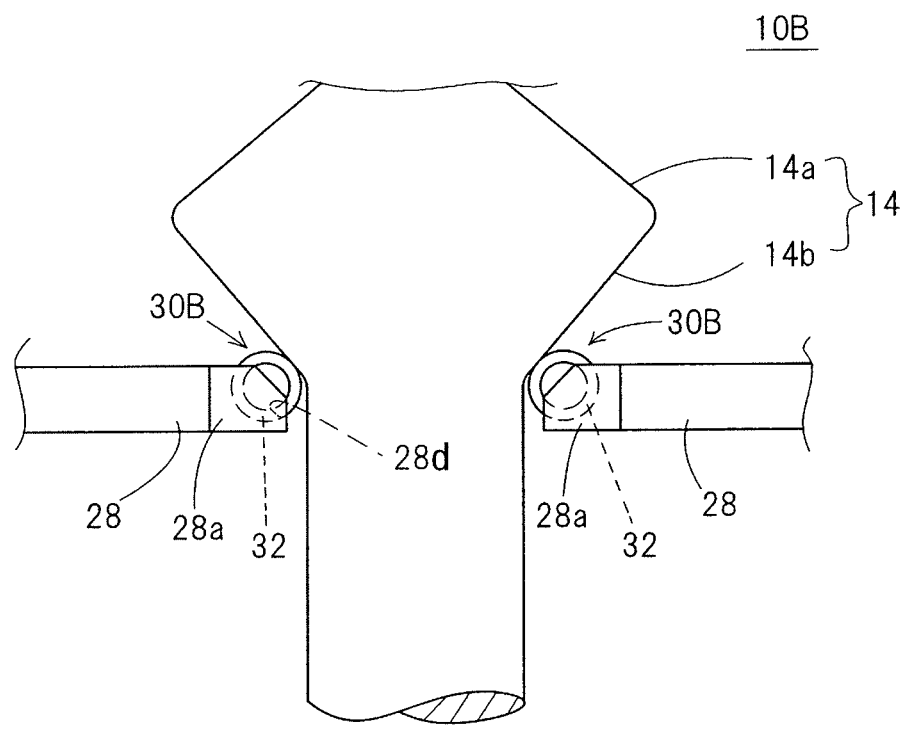
FIG. 9 is a main part enlarged front view showing a using state of a crystal holding mechanism of a single crystal pulling device according to Example 3 of the present invention.
Figure 10:
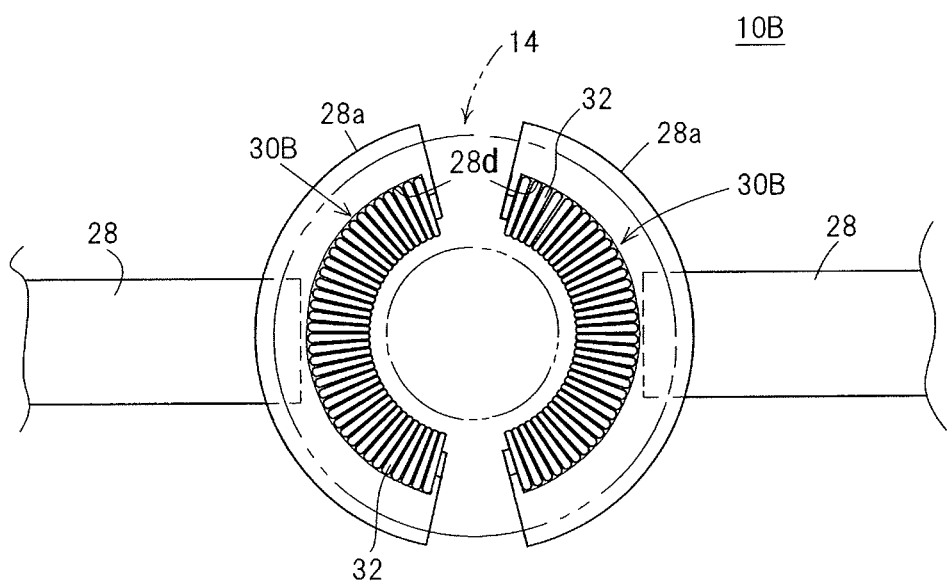
FIG. 10 is a main part enlarged plan view of the crystal holding mechanism of a single crystal pulling device according to Example 3 of the present invention.

As shown in FIG. 9 and FIG. 10, the crystal holding mechanism 10B of a single crystal pulling device of Example 3 of the present invention is characterized in that tapering to gradually reduce the width toward the tip is applied to upper portions of the distal ends of these grip claw portions 28, and that tungsten-made linear springs 32 having a diameter of 3 mm are wound many times in circular shapes to form supports 30B, and in upper surfaces of the distal end portions 28a of these grip claw portions 28, lower halves of the supports 30B are embedded throughout the entire length of the supports 30B. Specifically, in the distal end portions 28a having circular arc shapes in a plan view of these grip claw portions 28, fitting grooves 28d having circular arc shapes in a plan view and cross-sections orthogonal to the longitudinal direction of which have substantially semicircular shapes are respectively formed. In these fitting grooves 28d, linear springs 32 wound into coil shapes are respectively fitted in a compressed state. These linear springs 32 are firmly secured to the corresponding fitting grooves 28d by using spring forces to extend in the coil longitudinal direction. As a result, in addition to the same effects as those of Example 2, fitting and removal of the coils formed of the linear springs 32 is simplified.

Because other aspects of the configuration and the operation and effects are the same as those of Example 2, description will be omitted.

As above, a description has been given of examples of the present invention, but the present invention is characterized by the structure of distal end portions of grip claw portions, and of course, other aspects of the configuration than the grip claw portions (such as an opening and closing mechanism of the grip claw portions or a sandwiching mechanism of the engaging portion of a single crystal ingot, a rising and falling mechanism and rotating mechanism of the crystal holding mechanism) are not limited.

INDUSTRIAL APPLICABILITY

According to the present invention, even when the weight of a single crystal ingot to be grown increases, such as growth of a single crystal ingot having a diameter of 450 mm, the single crystal ingot growth can be safely performed without generation of rupture and dislocation in the single crystal ingot.

REFERENCE SIGNS LIST 10, 10A, 10B Crystal holding mechanism of single crystal pulling device,
11 Seed crystal,
13 Neck portion,
14 Engaging portion,
14a Increased diameter portion,
14b Reduced diameter portion,
15 Gripping member,
28b Slot,
28c Winding core portion,
29 Wire rope (linear spring),
29a Wire,
29b Strand,
30, 30A, 30B Support,
32 Linear spring,
I Single crystal silicon ingot (single crystal ingot).

The invention claimed is:

1. A crystal holding mechanism of a single crystal pulling device which, when pulling up a seed crystal dipped into a melt in a crucible to grow a single crystal ingot, holds the single crystal ingot by gripping by use of a gripping member an engaging portion that is formed in a section from a neck portion continuous from the seed crystal to an upper portion of the single crystal ingot and is composed of an increased diameter portion and a reduced diameter portion continuous from the increased diameter portion, wherein:

a support formed of a wire rope which elastically supports the engaging portion is provided on the gripping member, the wire rope formed by twisting together a plurality of strands, each strand of the plurality of strands formed by twisting together a plurality of wires, a pair of slots are formed penetrating through upper and lower surfaces of the gripping member, the pair of slots being separate from each other, the support is formed in an elliptical coil shape by winding the wire rope a plurality of times around a winding core formed between the pair of slots, and the major axis of the support extends in a vertical direction so as to project at upper end portions from an upper surface of the winding core.

2. A method for producing a single crystal ingot in which, when pulling up a seed crystal dipped into a melt in a crucible to grow the single crystal ingot, the single crystal ingot is held by a crystal holding mechanism, while the single crystal ingot is grown, wherein an engaging portion composed of an increased diameter portion and a reduced diameter portion continuous from the increased diameter portion is formed in a section from a neck portion continuous from the seed crystal to an upper portion of the single crystal ingot, the crystal holding mechanism has a gripping member on which a support formed of a wire rope which elastically supports the engaging portion is provided to grip the engaging portion, the wire rope formed by twisting together a plurality of strands, each strand of the plurality of strands formed by twisting together a plurality of wires, after formation of the engaging portion, by gripping the engaging portion by the gripping member, the engaging portion is elastically supported by the support, and growth of the single crystal ingot is performed in this state, a pair of slots are formed penetrating through upper and lower surfaces of the gripping member, the pair of slots being separate from each other, the support is formed in an elliptical coil shape by winding the wire rope a plurality of times around a winding core formed between the pair of slots, and the major axis of the support extends in a vertical direction so as to project at upper end portions from an upper surface of the winding core.

* * * * *